United States Patent [19]

Park

[11] Patent Number: 4,791,517

[45] Date of Patent: Dec. 13, 1988

[54] DETECTION OF UNSAFE VOLTAGES ON MOBILE EQUIPMENT

[75] Inventor: Jeffrey Park, Stoke Mandeville, England

[73] Assignee: Airtech Limited, Bunkinghamshire, England

[21] Appl. No.: 103,107

[22] Filed: Sep. 30, 1987

[30] Foreign Application Priority Data

Oct. 3, 1986 [GB] United Kingdom ............... 8623843

[51] Int. Cl.$^4$ .............................................. H02H 3/00
[52] U.S. Cl. ........................................ 361/1; 361/42; 307/116; 307/9; 307/326; 340/647; 340/650
[58] Field of Search ............... 361/1, 42, 86, 87, 88; 307/9, 10 R, 326, 327; 340/647, 650

[56] References Cited

U.S. PATENT DOCUMENTS 4,695,914 9/1987 Ohtsuki et al. ................. 361/1 X

FOREIGN PATENT DOCUMENTS 2444359 8/1980 France ........................... 307/326
10876 1/1980 Japan ............................ 307/326

Primary Examiner—A. D. Pellinen
Assistant Examiner—Derek S. Jennings
Attorney, Agent, or Firm—Lee & Smith

[57] ABSTRACT

Protective equipment detects the existence of an unsafe potential ($V_2$) between earth and mobile equipment such as a mobile cabin. A metal plate (14) is mounted below the chassis (10) of the cabin, and the voltage ($V_3$) between the metal plate (14) and the chassis (10) is detected by an amplifier (16). The amplifier output feeds a threshold detector (18) which senses when the voltage ($V_3$) reaches a level corresponding to a predetermined dangerous potential ($V_2$) of the chassis (10) with respect to ground (12).

7 Claims, 1 Drawing Sheet

DETECTION OF UNSAFE VOLTAGES ON MOBILE EQUIPMENT

FIELD OF THE INVENTION

This invention relates to the detection of unsafe voltages between earth and mobile equipment to which an AC voltage is supplied.

The term mobile equipment is intended to include wheeled or tracked vehicles such as lorries or tanks, as well as liftable cabins or containers.

BACKGROUND TO THE INVENTION

Mobile equipment such as a road vehicle fitted with communications equipment for military purposes has mains filters which result in large earth leakage currents, which will cause the vehicle chassis to become live in the event of mains earth failure. Conventional earth leakage detectors are not suitable because of the large earth leakage currents and voltage trip breakers require a separate reference earth and are often over sensitive to external vibration so that they trip out too frequently and in consequence are by-passed or shorted out in use. The invention aims to provide simple electric shock protection for users of mobile equipment.

According to the invention protective means for detecting the existence of an unsafe potential between earth and mobile equipment to which an AC voltage source is applied, comprises an electrically conductive member disposed between the equipment and earth, means for detecting the electric field strength between the mobile equipment and earth at the location of the conductive member and thereby deriving a measure of the potential difference between the mobile equipment and earth, and means responsive to a dangerous condition corresponding to a dangerous potential of the mobile equipment with respect to earth.

Said means for detecting the potential of the electrically conductive member with respect to the mobile equipment preferably comprise a high impedance amplifier and the means responsive to a dangerous condition preferably comprise a power trip for switching out the voltage source to the mobile equipment, or some form of alarm such as an audible or visual alarm.

The electrically conductive member is preferably a metal plate which is fixed with respect to the mobile equipment and which faces the ground, the metal member being spaced both from a chassis part of the mobile equipment and the ground so that the potential of the metal member is representative of the potential of the mobile equipment, the precise relationship depending on the relative values of the capacitances between the metal member and the mobile equipment and between the metal member and earth. It will be appreciated that the capacitances will depend on the area of the plate, the spacings between the mobile equipment and the metal member and between the metal member and the ground, and the dielectric constants of these spacings.

In a preferred embodiment the metal plate is bonded to a plastics material which is itself bonded to the underside of the equipment. In another embodiment the metal plate is included in a detector unit which is recessed into an aperture formed in the base of the mobile equipment, the detector plate being sealed and protected against the ingress of dirt or moisture into the detector unit.

The mobile equipment may be a wheeled or tracked road vehicle, such as a lorry or tank, or may be a mobile cabin or container.

BRIEF DESCRIPTION OF THE DRAWINGS

The invention will now be described, by way of example, with reference to the accompanying drawings which show a preferred embodiment of protective means in accordance with the invention. In the drawings.

DESCRIPTION OF THE PREFERRED EMBODIMENTS

Figure 1:
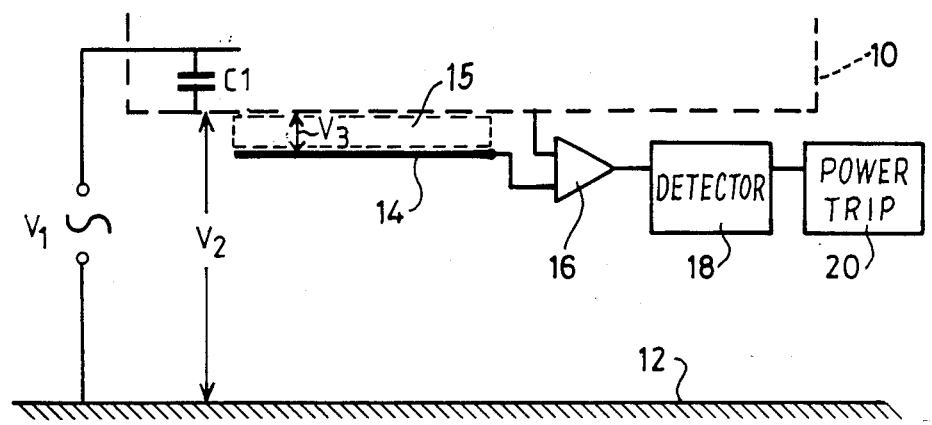
FIG. 1 is a schematic view of the protective means.

Referring first to FIG. 1, the vehicle chassis 10 is shown spaced above the ground 12. AC mains voltage $V_1$ is supplied to the vehicle which has filter capacitors indicated at C1 which give rise to leakage currents. These leakage currents cause a voltage $V_2$ to be set up between the vehicle chassis 10 and ground 12. The protective means monitor the voltage $V_2$ and disconnect the voltage supply $V_1$ if $V_2$ exceeds a dangerous potential which is likely to harm persons getting into or leaving the vehicle.

The voltage $V_2$ is detected by the use of a metal plate 14 which is mounted below the vehicle chassis in spaced relationship therefrom such that the space between the metal plate 14 and the ground 12 is unencumbered. The voltage $V_3$ between the metal plate 14 and the vehicle chassis 10 is detected by a high input impedance amplifier 16. The output of the amplifier 16 feeds a threshold detector 18 which is arranged to sense when the potential between the plate 14 and the vehicle chassis 10 reaches a level corresponding to the predetermined dangerous potential of the vehicle chassis 10 with respect to ground 12. When such a condition is sensed the detector 18 produces a signal which operates a power trip 20 to disconnect the voltage $V_1$.

Figure 2:
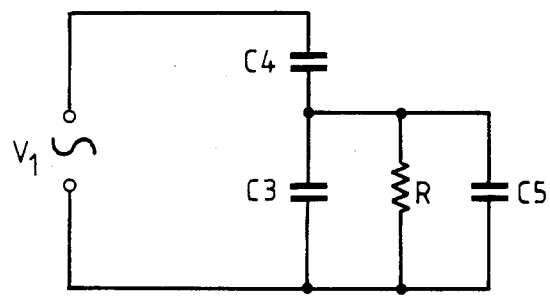
FIG. 2 shows an equivalent electrical circuit diagram.

FIG. 2 shows the equivalent electrical circuit diagram where C3 is the capacitance of the plate 14 to the vehicle chassis 10 and C4 is the capacitance of the metal plate 14 to ground 12. R is the lumped input resistance of the amplifier 16 and C5 is the lumped input capacitance of the amplifier. It will be appreciated that C5 is very much less than C4.

The metal plate 14 could consist of one surface of a glass fibre printed circuit board or other dielectric such as a plastics material 15, the other side of which is bonded to the chassis 10 of the vehicle. With the chassis 10 spaced one meter from the ground 12 the protective means can be made to trip when the chassis earth potential exceeds 25 volts. To achieve this, representative values are as follows: spacing between the chassis 10 and the plate 14 1.5 mm, size of plate 14 120 mm×120 mm, fibre glass dielectric between the plate 14 and vehicle chassis 10, air dielectric between the metal plate 14 and the ground 12.

Figure 3:
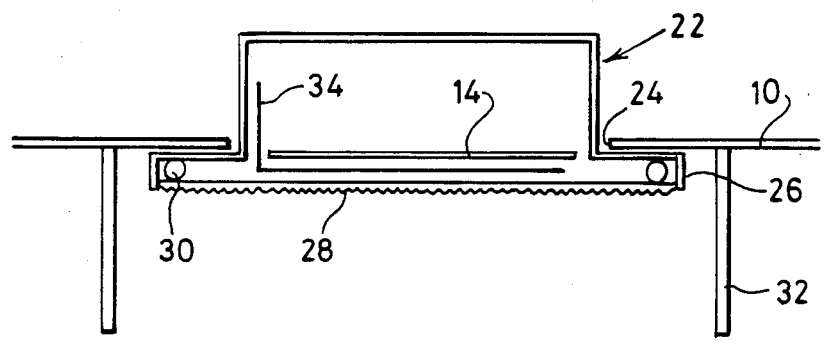
FIG. 3 illustrates a particular construction of the protective means.

FIG. 3 shows how the protective means may be made in the form of a detector unit 22 mounted in an aperture 24 in the base of the vehicle chassis 10. The metal plate 14 is shielded by a peripheral lip 26 and sealed against the ingress of dirt and moisture by means of a plastic lid 28 and an O ring seal 30. A surrounding plastics skirt 32 provides splash protection. A test probe 34 enables the unit 22 to be tested.

To give complete protection during initial connection of the voltage source $V_1$, the unit 22 may require its own battery back up.

The unit has the advantage of not requiring a separate earth reference (needed by voltage trip breakers), is immune to the problems caused by earth currents when large filters are fitted, and is not adversely affected by shocks or vibration.

I claim:

1. Protective means for detecting the existence of an unsafe potential between earth and mobile equipment to which an AC voltage source is applied, comprising an electrically conductive member disposed between the equipment and earth, detecting means for detecting the electric field strength between the mobile equipment and earth at the location of the conductive member, the detecting means detecting the electric field strength irrespective of any earth connection or earth leakage current between the mobile equipment and earth, the detecting means deriving from said electric field strength a signal representative of the potential difference between the mobile equipment and earth, and disconnection means fed by said signal from the detecting means and operative to disconnect the voltage source from the mobile equipment when said signal corresponds to a dangerous potential of the mobile equipment with respect to earth.

2. Protective means according to claim 2, wherein said means for detecting the electric field strength comprise a high impedance amplifier.

3. Protective means according to claim 1, wherein the means responsive to a dangerous condition comprise a power trip for switching out the voltage source to the mobile equipment.

4. Protective means according to claim 1, wherein the electrically conductive member is a metal plate which is fixed with respect to the mobile equipment and which faces the ground, the metal member being spaced both from a chassis part of the mobile equipment and the ground so that the potential of the metal member is representative of the potential of the mobile equipment.

5. Protective means according to claim 4, wherein the metal plate is bonded to a plastics material which is itself bonded to the underside of the equipment.

6. Protective means according to claim 4, wherein the metal plate is included in a detector unit which is recessed into an aperture formed in the base of the mobile equipment, the detector plate being sealed and protected against the ingress of dirt or moisture into the detector unit.

7. Protective means according to claim 1, wherein the mobile equipment is a wheeled or tracked road vehicle, or a mobile cabin or container.

* * * * *